(12) United States Patent
Lee

(10) Patent No.: US 7,884,005 B2
(45) Date of Patent: *Feb. 8, 2011

(54) METHOD OF MANUFACTURING A SEMICONDUCTOR DEVICE

(75) Inventor: Kun Hyuk Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/487,737

(22) Filed: Jun. 19, 2009

(65) Prior Publication Data

US 2009/0258483 A1 Oct. 15, 2009

Related U.S. Application Data

(63) Continuation of application No. 11/613,076, filed on Dec. 19, 2006, now Pat. No. 7,560,342.

(30) Foreign Application Priority Data

Dec. 29, 2005 (KR) .................. 10-2005-0133397

(51) Int. Cl.
H01L 21/3205 (2006.01)
H01L 21/4763 (2006.01)

(52) U.S. Cl. .................. 438/586; 438/258; 438/622; 438/637; 257/E21.584; 257/E21.585; 257/E21.683

(58) Field of Classification Search .......... 438/201, 438/211, 257–259, 266, 586, 588, 593, 618, 438/620, 622, 625–629, 631, 633, 637, 642, 438/643, 645, 648, 653, 656, 668, 675, 261, 438/283; 257/314–316, 365, E21.577, E21.584, 257/E21.585, E21.68, E21.681, E21.683, 257/E21.687, E21.91

See application file for complete search history.

(56) References Cited

U.S. PATENT DOCUMENTS 6,239,010 B1 * 5/2001 Lu .............................. 438/592

(Continued)

OTHER PUBLICATIONS

"High-k Dielectric", Dec. 15, 2005, Http://web.archive.org/web/20051215000000/http://en.wikipedia.org/wiki/High-k.

(Continued)

Primary Examiner—Matthew C Landau
Assistant Examiner—Joseph C Nicely
(74) Attorney, Agent, or Firm—Sherr & Vaughn, PLLC

(57) ABSTRACT

Embodiments relate to a method of manufacturing a semiconductor device that may simplify a manufacturing process and may reduce process costs. According to embodiments, the method may include simultaneously forming a first gate of a first device area and a second gate of a second device area, patterning a PMD layer to form a first contact hole exposing the first gate, depositing and planarizing a high dielectric constant material and first and second metallic materials on the semiconductor substrate to expose PMD layer, forming an insulating layer, a metal layer and a third gate in the first contact hole, patterning the PMD layer to form a second contact hole exposing the second gate, and depositing a third metallic material on the semiconductor substrate and planarizing it such that the PMD layer is exposed, thereby forming a contact in the second contact hole.

9 Claims, 10 Drawing Sheets

U.S. PATENT DOCUMENTS

| | | |
|---|---|---|
| 6,251,729 B1 | 6/2001 | Montree et al. |
| 6,287,951 B1 | 9/2001 | Lucas et al. |
| 6,429,480 B1 | 8/2002 | Koishikawa |
| 6,476,488 B1 * | 11/2002 | Jeng et al. .................. 257/751 |
| 6,495,877 B1 * | 12/2002 | Hsue et al. .................. 257/306 |
| 6,495,881 B1 | 12/2002 | Ahmed et al. |
| 6,524,912 B1 | 2/2003 | Yang et al. |
| 6,649,955 B2 * | 11/2003 | Lee .............................. 257/295 |
| 6,756,625 B2 | 6/2004 | Brown |
| 6,869,872 B2 | 3/2005 | Suh |
| 7,338,860 B2 | 3/2008 | Kwon |
| 7,368,402 B2 * | 5/2008 | Vaartstra et al. ............. 438/785 |
| 2003/0205823 A1 | 11/2003 | Leu et al. |
| 2006/0006441 A1 * | 1/2006 | Park et al. .................. 257/296 |
| 2006/0046387 A1 | 3/2006 | Choi et al. |
| 2006/0065939 A1 | 3/2006 | Doczy et al. |
| 2007/0090427 A1 | 4/2007 | Nakajima |
| 2007/0161277 A1 | 7/2007 | Baars et al. |

OTHER PUBLICATIONS

Snow, E.H., et al. "Polarization Phenomena and Other Properties of Phosphosilicate Glass . . .", Mar. 1966, Journal of the Electrochemical Society, vol. 113, No. 3, p. 264-266.

* cited by examiner

METHOD OF MANUFACTURING A SEMICONDUCTOR DEVICE

The present application is a continuation application of U.S. patent application Ser. No. 11/613,076 (filed on Dec. 19, 2006) now U.S. Pat. No. 7,560,342 which claims priority under 35 U.S.C. 119 and 35 U.S.C. 365 to Korean Patent Application No. 10-2005-0133397 (filed on Dec. 29, 2005), which is hereby incorporated by reference in its entirety.

BACKGROUND

Semiconductor devices may be divided into various categories, including memory devices and non-memory devices. In memory devices, information may be stored, and in non-memory devices, information may not be stored.

Memory devices may be generally divided into volatile memory devices, in which recorded information may be erased and new information may be stored, and non-volatile memory devices, in which information recorded once may be permanently stored.

Volatile memory devices may include RAM (Random Access Memory), which may allow information to be written and read. Non-volatile memory may include ROM (Read Only Memory), EPROM (Erasable Programmable ROM), and EEPROM (Electrically Erasable Programmable ROM), which may allow information to be read.

Memory and non-memory devices may be simultaneously designed in accordance with a various known layouts on a semiconductor substrate.

FIG. 1 is an example sectional diagram showing a semiconductor device having memory and non-memory devices.

Referring to FIG. 1, memory and non-memory devices 1 and 2 may be formed on a semiconductor substrate 3.

Memory device 1 may include gate insulating layer 6a, floating gate 7, interlayer dielectric layer 8, and control gate 9. These elements may be stacked. Source and drain areas 4a and 4b may be formed at both side areas of control gate 9.

Interlayer dielectric layer 8 may be an ONO (Oxide-Nitride-Oxide) layer. Floating gate 7 may be an area in which information is written. Gate insulating layer 6a may be formed to isolate semiconductor substrate 3 and floating gate 7. Control gate 9 may be formed to control floating gate 7, for example to write or delete information. Interlayer dielectric layer 8 may be formed to isolate floating gate 7 and control gate 9.

Spacer 10a may be formed at sides of gate insulating layer 6a, floating gate 7, interlayer dielectric layer 8 and control gate 9.

In non-memory device 2, gate insulating layer 6b and general gate 9a may be stacked. Source and drain areas 5a and 5b may be formed at both side areas of general gate 9a. General gate 9a may conduct and cut off a channel area between source and drain areas 5a and 5b such that signals may be transmitted therebetween.

Further, gate insulating layer 6b may be formed to isolate semiconductor substrate 3 and general gate 9a. Spacer 10b may be formed at sides of gate insulating layer 6b and general gate 9a.

PMD (Pre-Metallic Dielectric) layer 12 may be formed on semiconductor substrate 3. PMD layer 12 may include contact holes for electrical connections to general gate 9a, control gate 9, source areas 4a and 5a, and drain areas 4b and 5b. Metal interconnection 13 may be formed through each of the contact holes, and tungsten (W) 11 may be filled in the contact hole.

Control gate 9 may include a material substantially identical to a material forming general gate 9a.

Therefore, control gate 9 and general gate 9a may be formed through a one-time mask process in a semiconductor process.

However, since a step difference may exist between control gate 9 and general gate 9a, focuses for exposure may be different from each other when performing an exposure process, for example to form a photoresist pattern. For this reason, it may not be possible to simultaneously form control gate 9 and general gate 9a through a one-time mask process.

For example, since control gate 9 may be formed on floating gate 7 and interlayer dielectric layer 8, control gate 9 may be positioned higher than general gate 9a by a height of floating gate 7 and interlayer dielectric layer 8.

Accordingly, a step difference may be formed as high as floating gate 7 and interlayer dielectric layer 8 between control gate 9 and general gate 9a.

Thus, if a focus for exposure is adjusted on a photoresist on interlayer dielectric layer 8 to deposit the photoresist on semiconductor substrate 3 including interlayer dielectric layer 8 and then expose the photoresist, the focus may not be properly adjusted on the photoresist in an area in which general gate 9a will be formed.

If an exposure is then performed, an exact photoresist pattern may be formed on interlayer dielectric layer 8, while the precise photoresist pattern may not formed on an area in which general gate 9a will be formed.

Thus, since a general gate having an inexact CD (Critical Dimension) may be formed where patterning is performed using an inexact photoresist as a mask, an inexact operation may be accomplished by such a general gate.

Therefore, it may be necessary for a control gate and a general gate, which may have the same material, to be formed through a two-time mask process and not through a one-time mask process. Such a process may be complicated, expensive, and time consuming.

SUMMARY

Embodiments relate to a semiconductor device. Embodiments relate to a method of manufacturing a semiconductor device that may simplify a process and reduce process costs.

Embodiments relate to a method of manufacturing a semiconductor device, in which a general gate of a non-memory device and a floating gate of a memory device may be simultaneously formed so that a process may be simplified and process costs can be reduced.

Embodiments relate to a method of manufacturing a semiconductor device, in which a control gate may include a metallic material so that the performance of the control gate may be enhanced.

According to embodiments, a method of manufacturing a semiconductor device in which first and second areas may be defined on a semiconductor substrate, and first and second devices may respectively be formed in the first and second areas, may include simultaneously forming a first gate of the first device area and a second gate of the second device area, depositing a PMD layer on the semiconductor substrate and then patterning it, thereby forming a first contact hole such that the first gate may be exposed, depositing a high dielectric constant material and first and second metallic materials on the semiconductor substrate and then planarizing them such that the PMD layer may be exposed, thereby forming an insulating layer, a metal layer and a third gate in the first contact hole, patterning the PMD layer, thereby forming a second contact hole such that the second gate may be exposed, and depositing a third metallic material on the semiconductor substrate and then planarizing it such that the PMD layer may be exposed, thereby forming a contact in the second contact hole.

According to embodiments, a method of manufacturing a semiconductor device in which first and second areas may be defined on a semiconductor substrate, and first and second devices may be respectively formed in the first and second areas, may include simultaneously forming a first gate of the first device area and a second gate of the second device area, depositing a first PMD layer on the semiconductor substrate and then patterning it, thereby forming a first contact hole such that the first gate may be exposed, depositing a high dielectric constant material and first and second metallic materials on the semiconductor substrate and then planarizing them such that the first PMD layer may be exposed, thereby forming an insulating layer, a metal layer and a third gate in the first contact hole, depositing a second PMD layer on the semiconductor substrate and then patterning it, thereby forming a second contact hole such that second and third gates may be exposed, and depositing a third metallic material on the semiconductor substrate and then planarizing it such that the second PMD layer may be exposed, thereby forming a contact in the second contact hole.

DETAILED DESCRIPTION OF EMBODIMENTS

Figure 1:
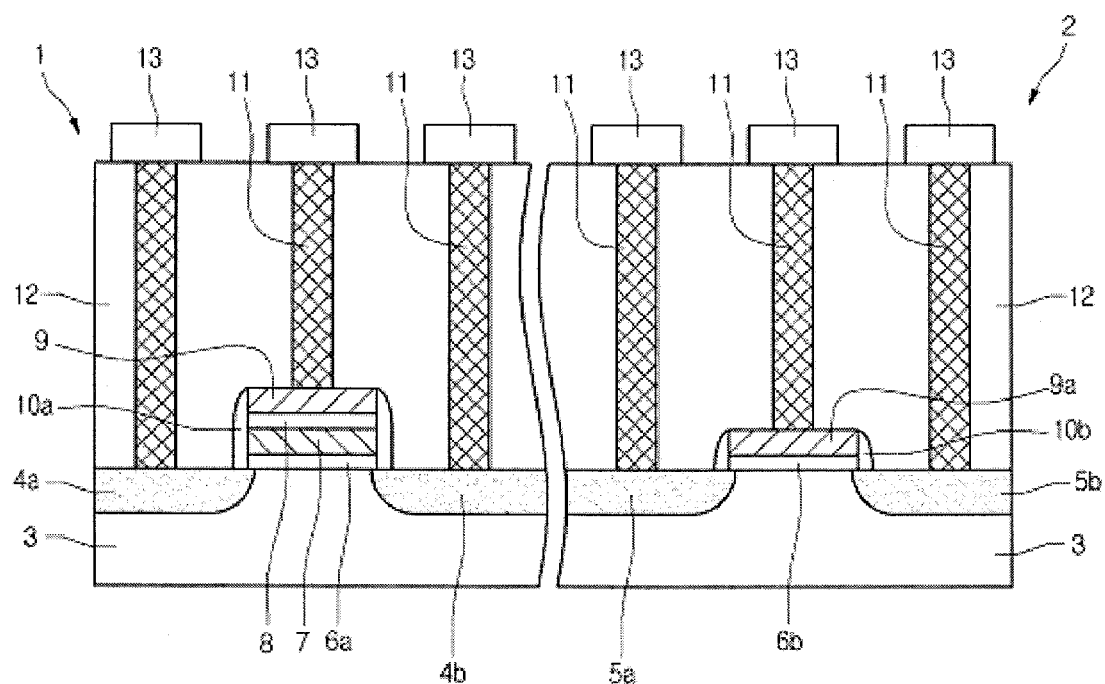
FIG. 1 is an example sectional diagram illustrating a semiconductor device having memory and non-memory devices.
Figure 2A:
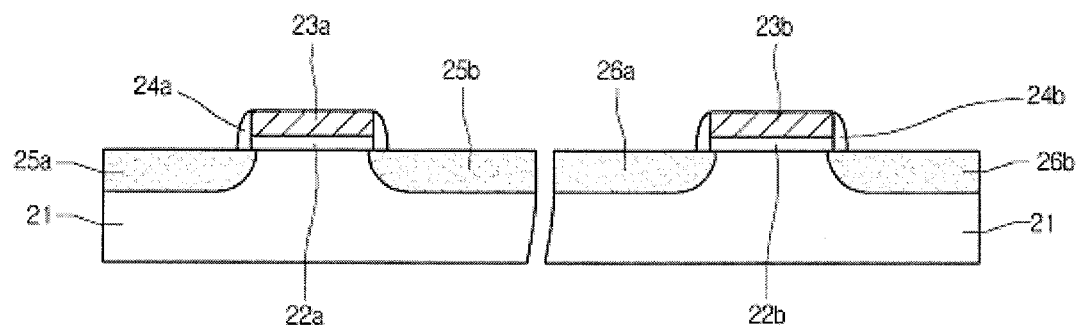
FIGS. 2a to 2i are example sectional diagrams illustrating a semiconductor and a process of manufacturing a semiconductor according to embodiments.

Referring to FIG. 2a, semiconductor substrate 21 may include areas in which memory and non-memory devices will be formed. A plurality of memory and non-memory devices may be formed on semiconductor substrate 21.

Memory devices, non-memory devices, and memory and non-memory devices may be isolated by a field oxide layer (not shown). Thus, a region of each of the devices may be defined by the field oxide layer.

General gate (as distinguished from floating and control gates) 23b and first source and drain regions 26a and 26b may be formed in a non-memory device area on semiconductor substrate 21. Further, floating gate 23a and second source and drain areas 25a and 25b may be formed in the memory device area.

First gate oxide layer 22b may be formed between general gate 23b and semiconductor substrate 21. First gate oxide layer 22b may provide isolation between general gate 23b in substrate 21. Second oxide layer 22a may be formed between the floating gate 23a and semiconductor substrate 21, and may provide isolation therebetween.

First spacers 24b may be formed at both side surfaces of first gate oxide layer 22b and general gate 23b, and second spacers 24a may be formed at both side surfaces of second gate oxide layer 22a and the floating gate 23a.

General gate 23b may include a material substantially identical to a material used to form floating gate 23a. General gate 23b and floating gate 23a may be simultaneously formed through a one-time mask process.

In embodiments, a gate oxide layer and a poly-silicon layer may be deposited on the semiconductor substrate, and a photoresist may be coated on the poly-silicon. A photoresist pattern may then be formed, for example through an exposure and development process. A patterning process may then be performed, for example using the photoresist pattern as a mask. General gate 23b and floating gate 23a may thereby respectively be formed in the non-memory and memory device areas.

First source and drain areas 26a and 26b of the non-memory device may be formed through an ion implantation process, for example by using general gate 23b and first spacers 24b as a mask.

Second source and drain regions 25a and 25b of the memory device may be formed through an ion implantation process, for example by using floating gate 23a and second spacers 24a as a mask.

Figure 2B:
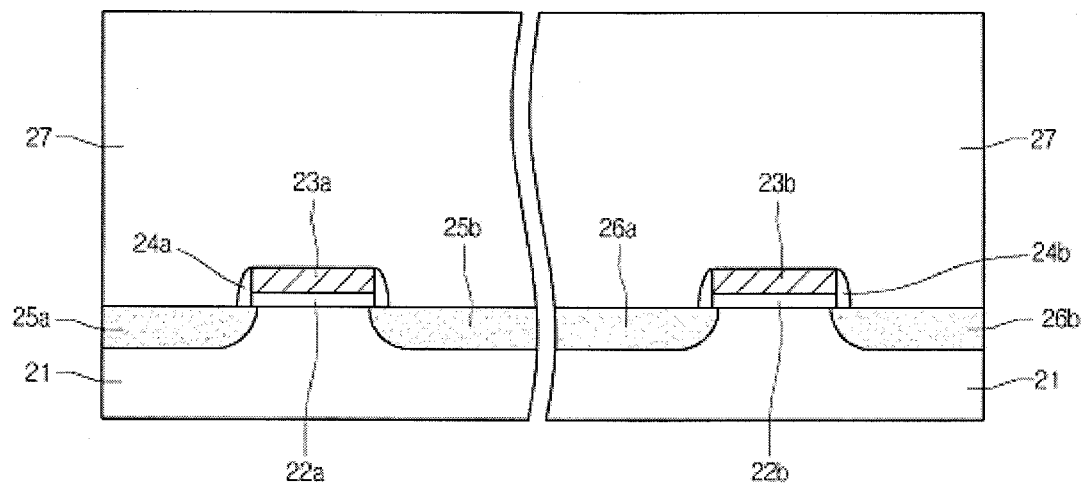

Referring to FIG. 2b, a PMD layer 27 may be deposited on semiconductor substrate 21 having general gate 23b and floating gate 23a.

Figure 2C:
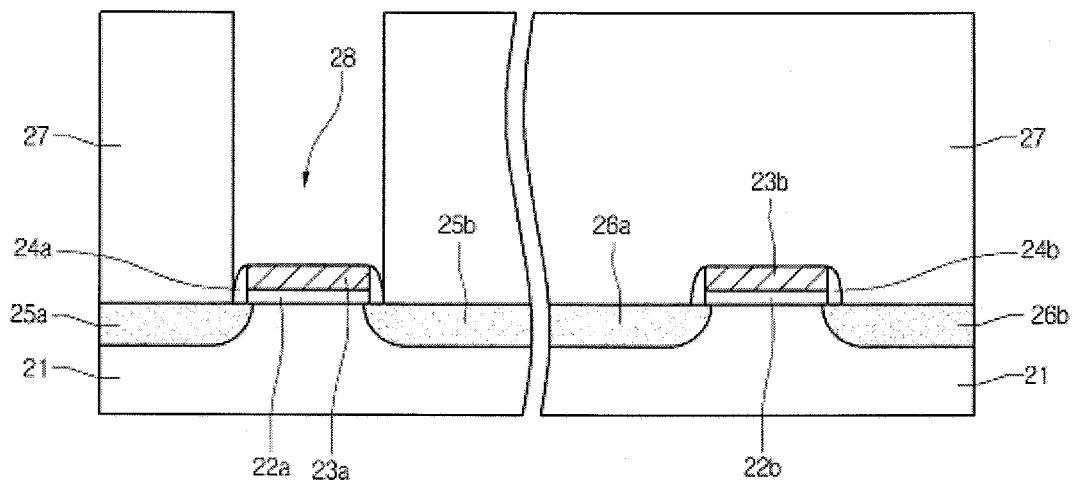

Referring to FIG. 2c, first contact hole 28 may be formed by patterning PMD layer 27 such that floating gate 23a and second spacers 24a of the memory device may be exposed. According to embodiments, first contact hole 28 may be formed through an RIE process.

Figure 2D:
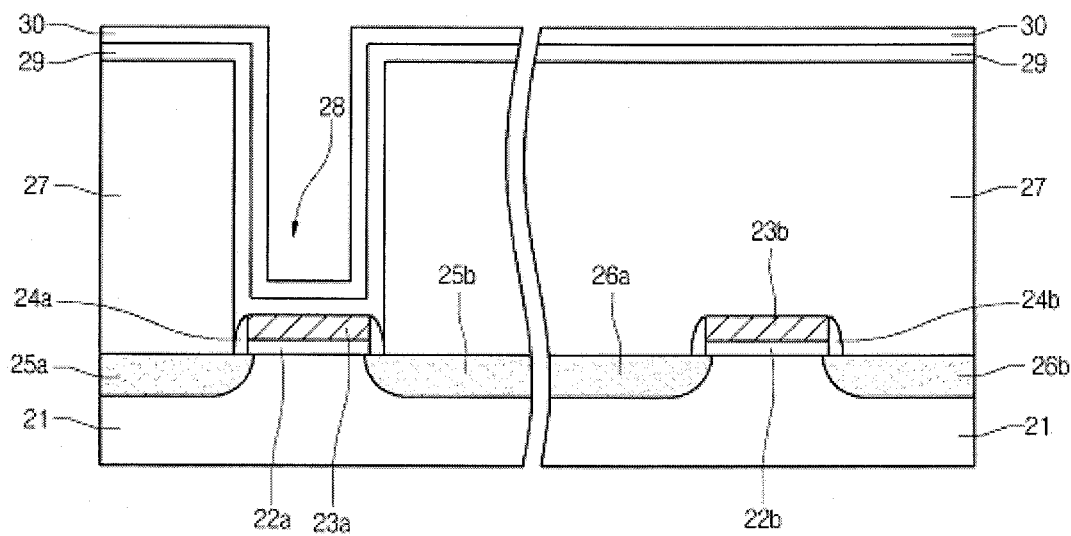

Referring to FIG. 2d, high dielectric constant (high k) material (e.g., $Al_2O_3$ or the like) 29 and barrier metal (e.g., Ti, TiN or the like) 30 may be sequentially deposited on semiconductor substrate 21.

Figure 2E:
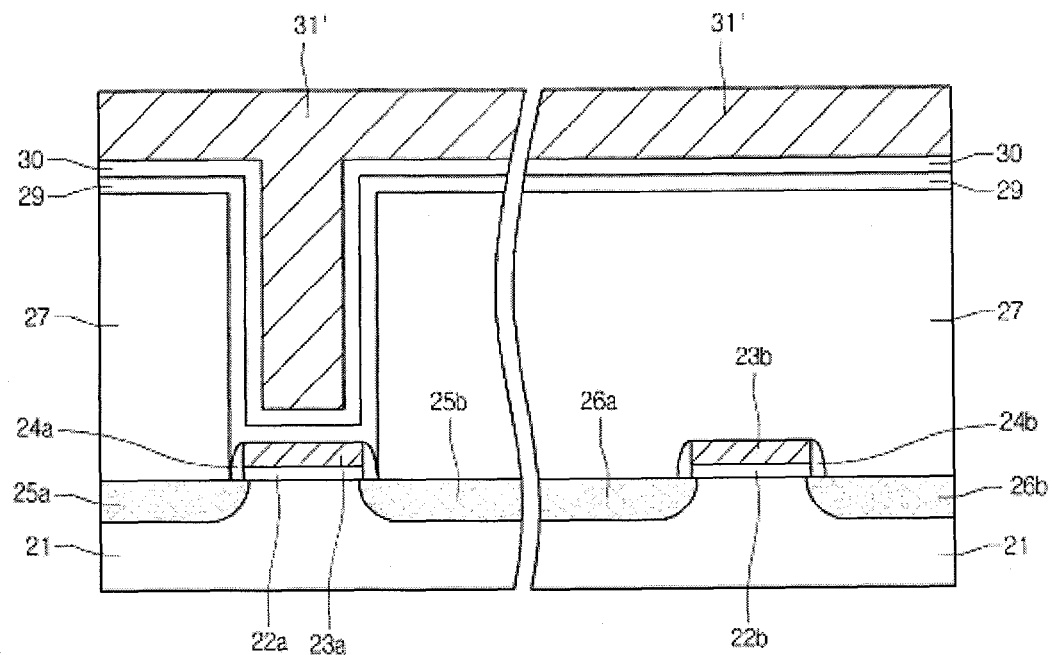

Referring to FIG. 2e, metallic material 31' such as tungsten (W) may be deposited on barrier metal 30.

Figure 2F:
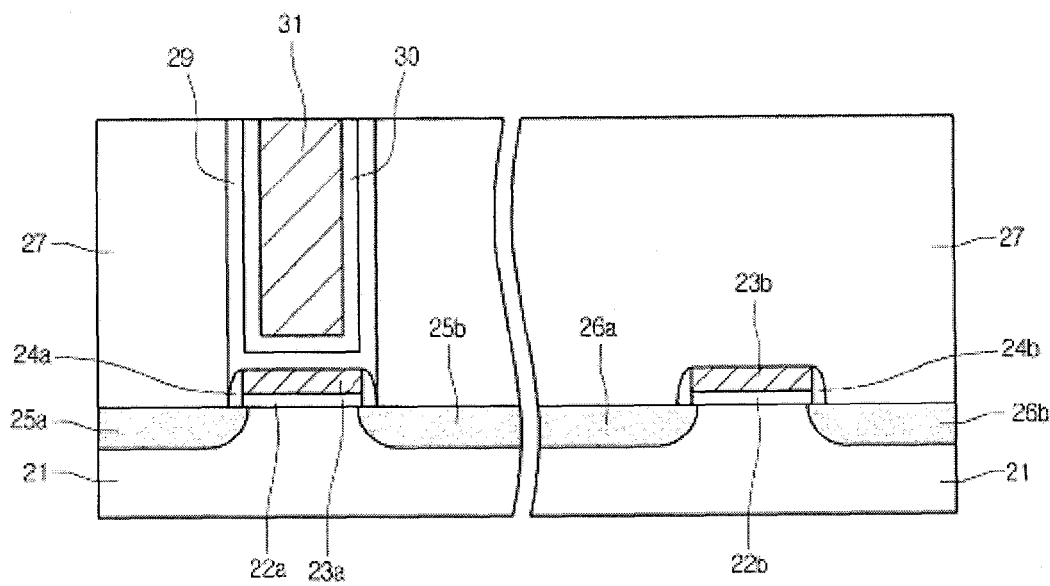

Referring to FIG. 2f, metallic material 31' may be planarized, for example through a CMP process. PMD layer 27 may thus be exposed. Accordingly, metallic material 31' may be formed only in first contact hole 28, and control gate 31 may be formed by metallic material 31' formed in first contact hole 28.

High dielectric constant material 29 and barrier metal 30 may be stacked on side and bottom surfaces of first contact hole 28. Control gate 31 may be formed on barrier metal 30. High dielectric constant material 29 may induce higher capacitance so that more information may be recorded. Barrier metal 30 may be formed, and may increase the adhesion of control gate 31.

In general, a control gate may include poly-silicon. According to embodiments, control gate 31 may include a metallic material such as tungsten. Current loss may thereby be minimized since a resistance of the metallic material may be lower than that of the poly-silicon. In embodiments, exact operational control may be possible and a performance of control gate 31 may be enhanced.

Figure 2G:
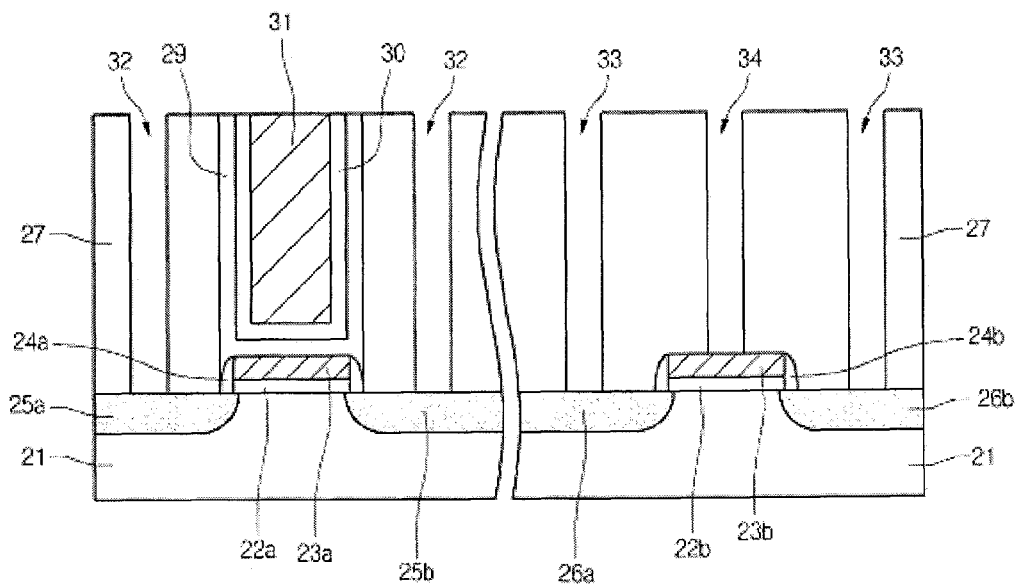

Referring to FIG. 2g, PMD layer 27 may be patterned through an RIE process, and second contact holes 33 and 34 may thus be formed. First source and drain areas 26a and 26b and general gate 23b of the non-memory device are may be respectively exposed through second contact holes 33 and 34. Third contact holes 32 may also be formed, through which second source and drain areas 25a and 25b may be respectively exposed.

Figure 2H:
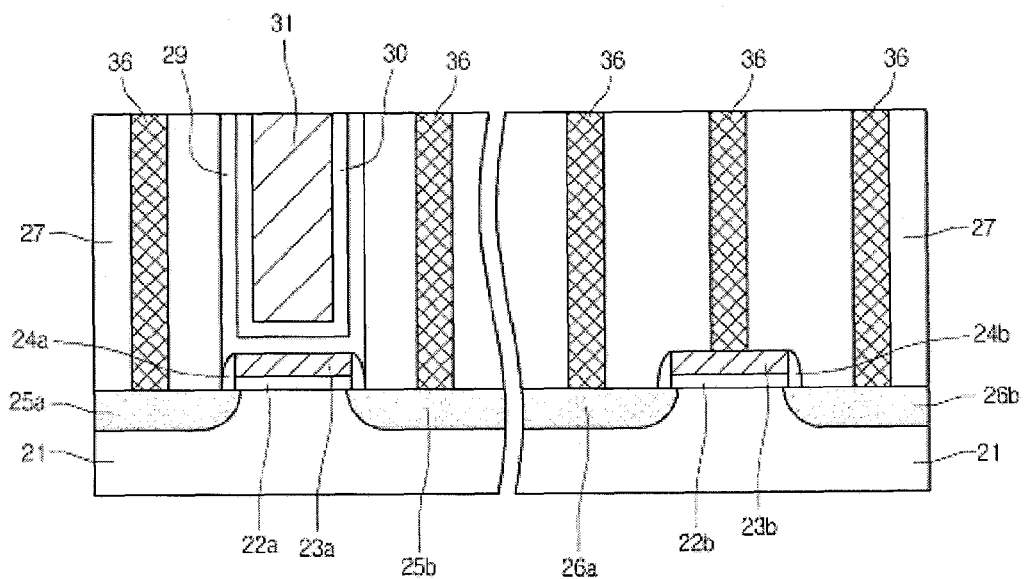

Referring to FIG. 2h, a metallic material such as tungsten may be deposited on PMD layer 27 having the second and third contact holes 32, 33 and 34, and then planarized, for example through a CMP process. PMD layer 27 may thus be exposed, thereby forming contacts 36 in the second and third contact holes 32, 33 and 34. Contact 36 may include a metallic material (e.g., tungsten) identical to or different from a material forming barrier metal 30.

Figure 2I:
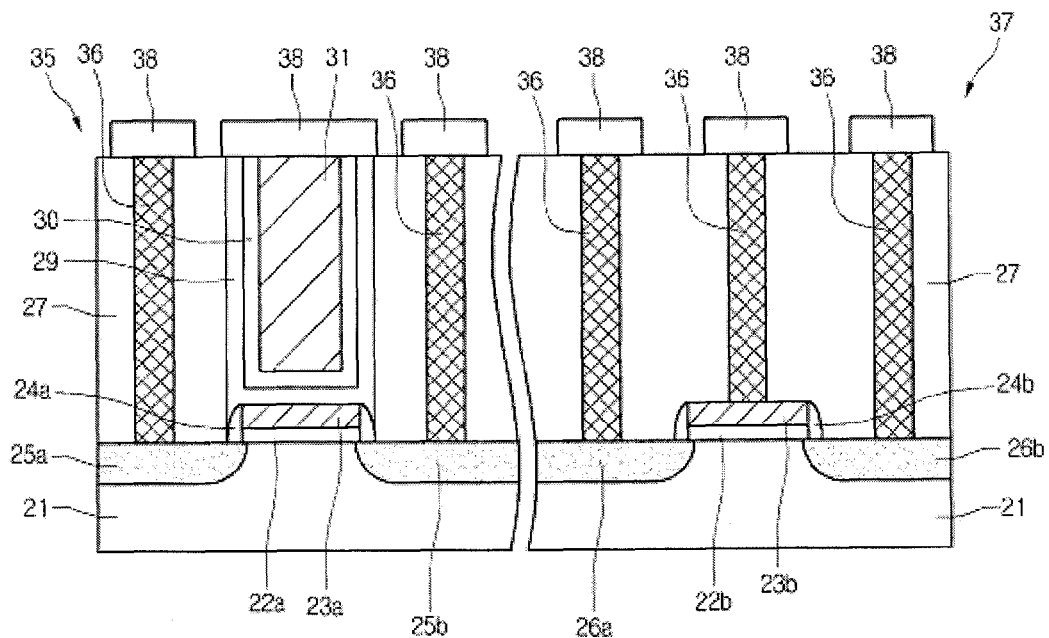

Referring to FIG. 2i, a metallic material such as Al or Cu may be deposited on PMD layer 27 and may be patterned, thereby forming metal interconnections 38 on contacts 36.

According to embodiments, a plurality of memory and non-memory devices 35 and 37 may be simultaneously formed on semiconductor substrate 21.

According to embodiments, general gate 23b of non-memory device 37 and floating gate 23a of memory device 35 may be simultaneously formed. Hence, a manufacturing process may be simplified, and costs may be reduced.

In addition, according to embodiments, control gate 31 may include a metallic material, which may increase conductivity, for example as compared with related art techniques. Hence, and exact operation may be controlled.

FIGS. 3a to 3h are example sectional diagrams illustrating a semiconductor and a process of manufacturing a semiconductor according to embodiments.

FIGS. 3a to 3f illustrate the same components as to FIGS. 2a to 2f, and will accordingly be only briefly described for convenience of explanation.

Figure 3A:
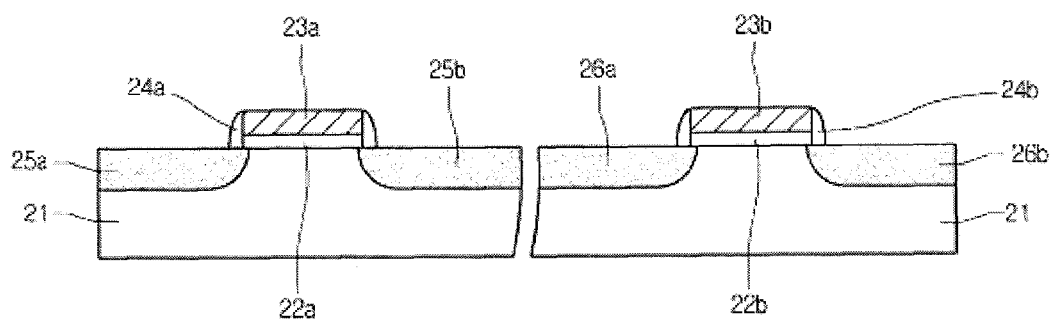
FIGS. 3a to 3h are example sectional diagrams illustrating a semiconductor and a process of manufacturing a semiconductor according to embodiments.

Referring to FIG. 3a, general gate 23b and first source and drain areas 26a and 26b may be formed in a non-memory device area of semiconductor substrate 21. Floating gate 23a and second source and drain areas 25a and 25b may be formed in a memory device area of semiconductor substrate 21. First and second gate insulating layers 22a and 22b may be formed between respective gates 23a and 23b and semiconductor substrate 21, and first and second spacers 24a and 24b may be formed on side surfaces of respective gates 23a and 23b.

Figure 3B:
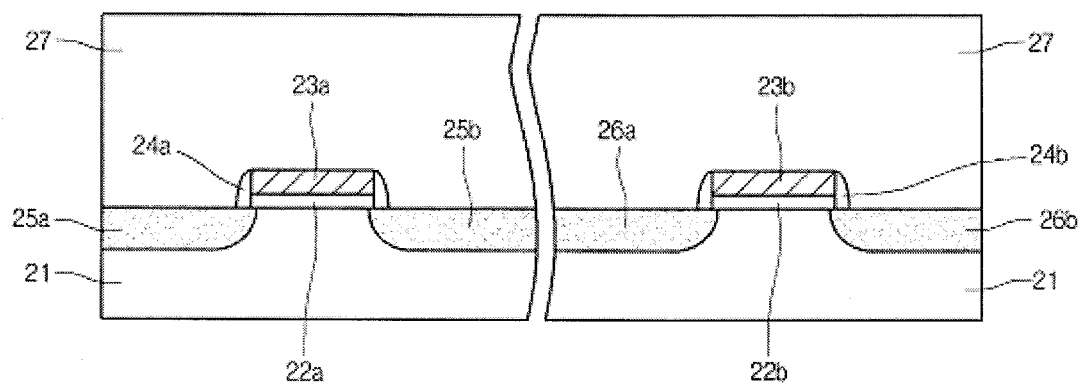
Figure 3C:
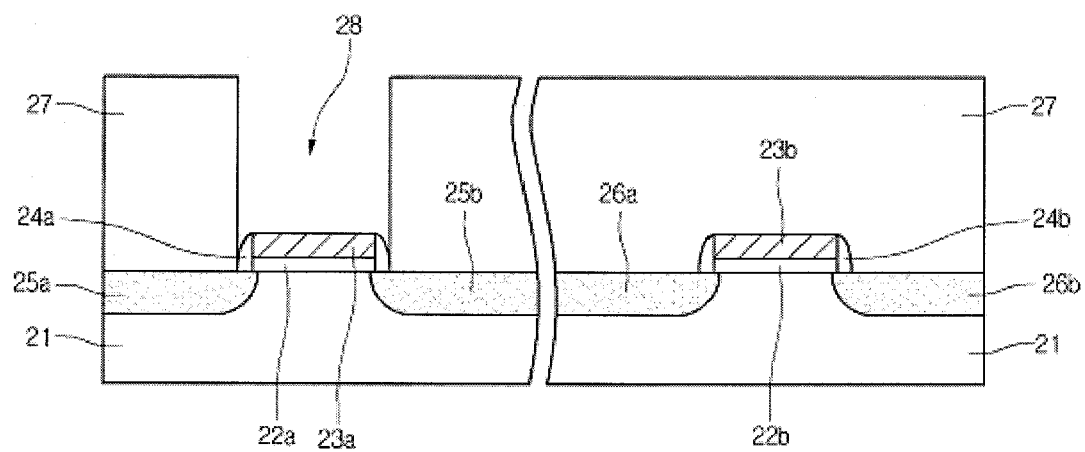

Referring to FIG. 3b, first PMD film 27 may be deposited on semiconductor substrate 21. Referring to FIG. 3c, first contact hole 28 may be formed, for example through an RIE process such that floating gate 23a and second spacer 24a in the memory device area may be exposed.

Figure 3D:
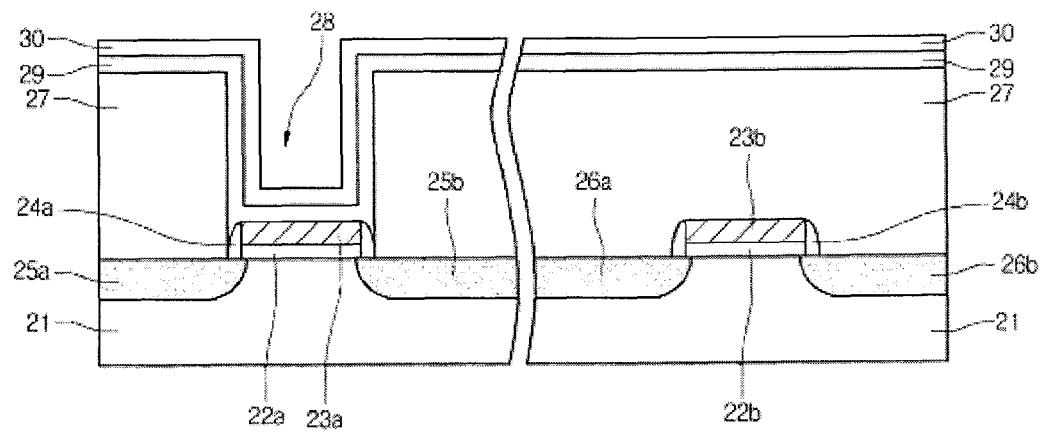

Referring to FIG. 3d, high dielectric constant material 29 such as $Al_2O_3$ and barrier metal 30 such as Ti or TiN may be sequentially deposited.

Figure 3E:
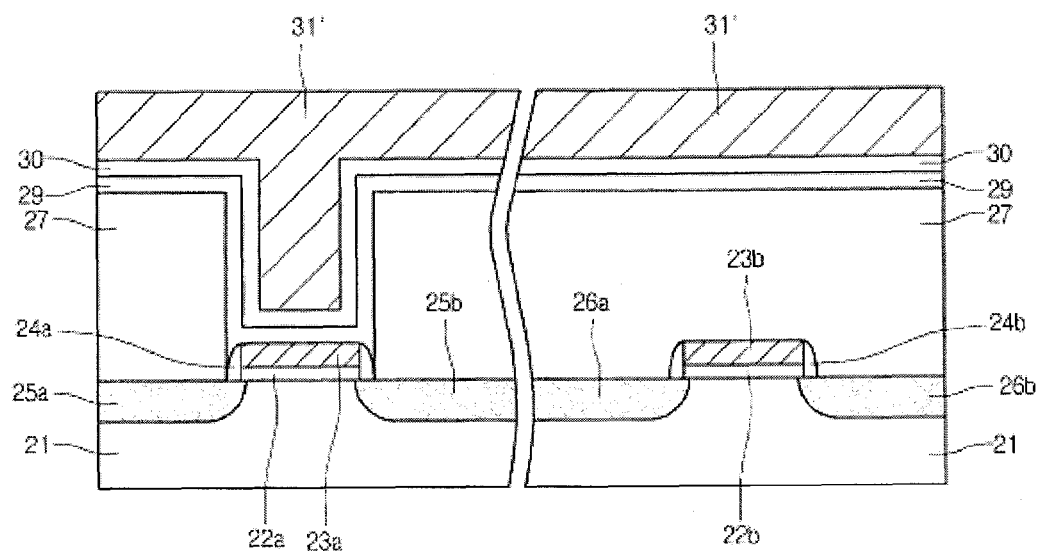

Referring to FIG. 3e, metallic material 31' such as tungsten may be deposited on barrier metal 30 and planarized through a CMP process.

Figure 3F:
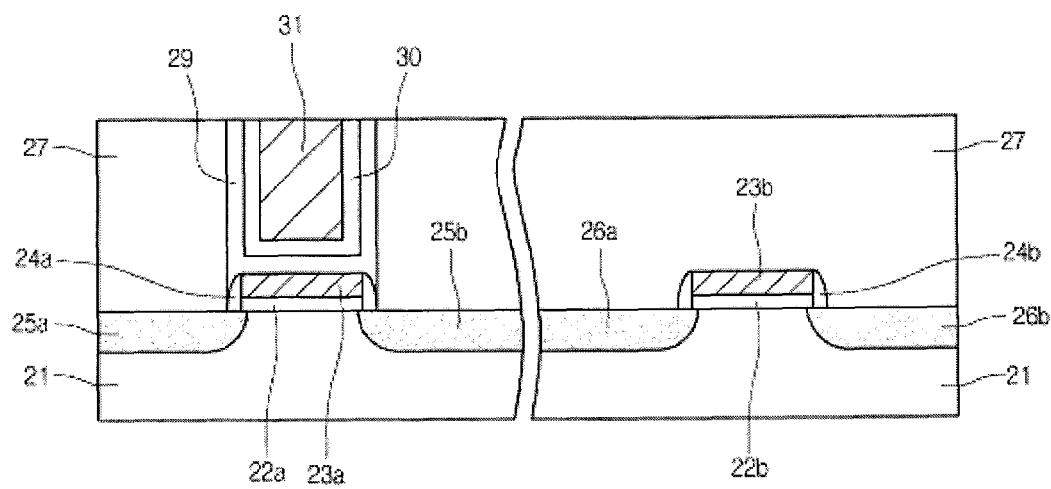

Referring to FIG. 3f, control gate 31 in first contact hole 28 may thus be formed.

Figure 3G:
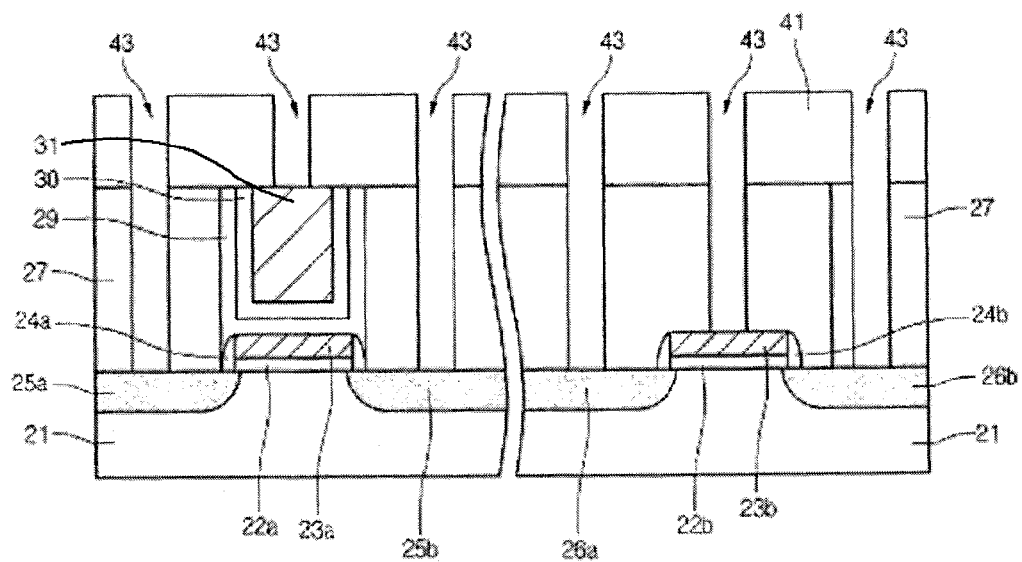

Referring to FIG. 3g, after forming control gate 31, second PMD layer 41 may be deposited on semiconductor substrate 21. Second contact holes 43 may be formed such that respective gates 23b and 31, first and second source areas 25a and 26a, and first and second drain areas 25b and 26b may be exposed. Thus second contact holes 43 may be formed in the non-memory device area such that general gate 23b and first source and drain areas 26a and 26b may be exposed, and second contact holes 43 may be formed in the memory device area such that floating gate 23a and second source and drain areas 25a and 25b may be exposed.

Second PMD film 41 may include a dielectric material identical to or different from a material used to form first PMD film 27.

Figure 3H:
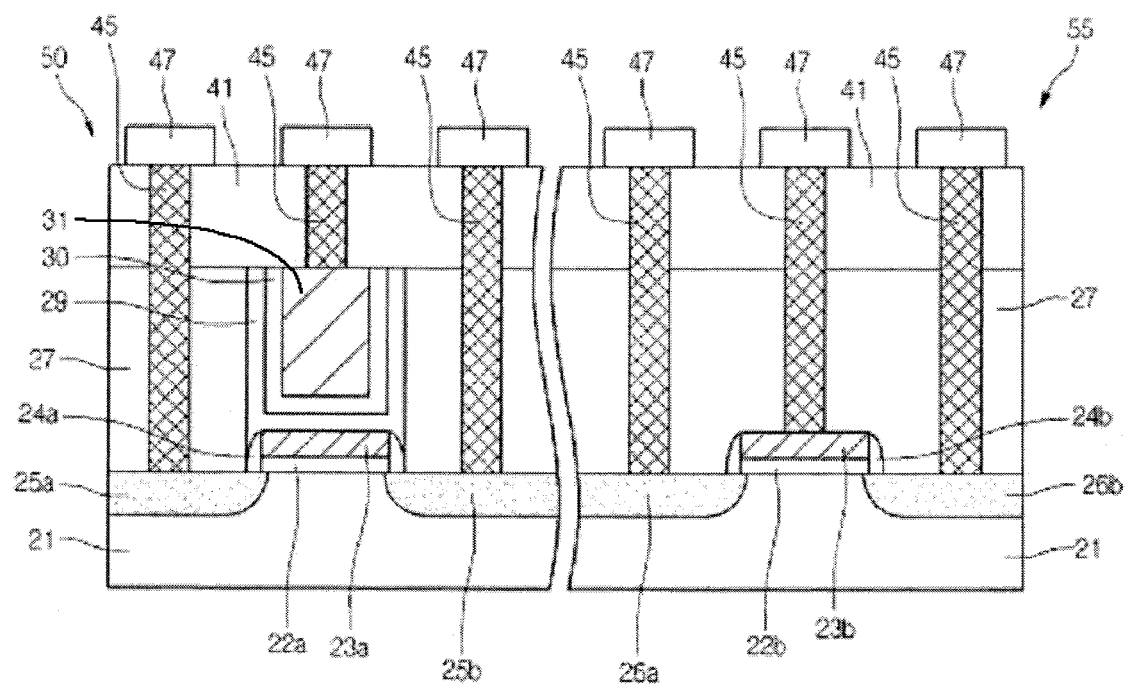

Referring to FIG. 3h, a metallic material such as tungsten may be deposited on semiconductor substrate 21 and planarized, for example through a CMP process. Contacts 45 may thus be formed in contact holes 43. A metallic material such as Al or Cu may be deposited on contacts 45 and then patterned. Metal interconnections may thus be formed on contacts 45. Contacts 45 may include a metallic material (e.g., tungsten) identical to barrier metal 30 or a metallic material different therefrom.

Accordingly, a plurality of memory and non-memory devices 50 and 55 may be simultaneously formed on semiconductor substrate 21.

According to embodiments, general gate 23b of the non-memory device 55 and floating gate 23a of the memory device 50 may be simultaneously formed, and a manufacturing process may thus be less complicated and less expensive.

Further, according to embodiments, control gate 31 may include a metallic material, which may increase conductivity, for example as compared to related are techniques. An exact operation may therefore be controlled.

Furthermore, in embodiments, second PMD layer 41 may be added. Hence, control gate 31 may not exposed directly to the outside, and an occurrence of a short circuit due to metal interconnections intersecting each other may be prevented.

According to embodiments, a general gate of a non-memory device and a floating gate of a memory device may be simultaneously formed, and a process can be simplified and process costs may be reduced.

According to embodiments, a control gate 31 may include a metallic material, and may have a high conductivity. Hence, an operation may be better controlled.

According to embodiments, a second PMD layer may also be formed. A control gate may not be exposed directly to the outside. A short circuit due to metal interconnections intersecting each other may be therefore be prevented.

According to embodiments, an interlayer dielectric layer may include a high dielectric constant material such as $Al_2O_3$ rather than an existing ONO layer. Accordingly, a process may be simplified and costs may be reduced. For example, since an ONO layer may be prepared as three layers, three-time deposition, one-time exposure, RIR, and wet etching processes may be added, and may cause a process to be very complicated. On the contrary, according to embodiments, an interlayer dielectric layer may simply include a high dielectric constant material such as $Al_2O_3$, and a process may be simplified and costs may be reduced.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   simultaneously forming a first gate of a first device area and a second gate of a second device area over a semiconductor substrate;
   depositing a first Pre-Metallic Dielectric (PMD) layer on the semiconductor substrate and patterning it to form a first contact hole exposing the first gate;
   forming an insulating layer, a metal layer, and a third gate in the first contact hole by depositing a high dielectric constant material and first and second metallic materials over the semiconductor substrate and planarizing them to expose the first PMD layer;
   forming second contact holes by depositing a second PMD layer on the semiconductor substrate and patterning the second PMD layer to expose the second and third gates; and
   forming contacts in the second contact holes by depositing a third metallic material on the semiconductor substrate and planarizing it to expose the second PMD layer.

2. The method of claim 1, wherein the insulating layer forms capacitance.

3. The method of claim 1, wherein the high dielectric constant material comprises $Al_2O_3$.

4. The method of claim 1, wherein the metal layer is configured to couple the third gate to the insulating layer.

5. The method of claim 1, wherein the first metallic material comprises Ti or TiN.

6. The method of claim 1, wherein the third gate comprises a metallic material identical to a metallic material forming the contact.

7. The method of claim 1, wherein the third gate comprises a metallic material different from a material forming the contact.

8. The method of claim 1, wherein the first PMD layer comprises an insulating material identical to a material forming the second PMD layer.

9. The method of claim 1, wherein the first PMD layer comprises an insulating material different from a material forming the second PMD layer.

* * * * *